US008077058B2

(12) United States Patent
Swatsky et al.

(10) Patent No.: US 8,077,058 B2
(45) **Date of Patent: *Dec. 13, 2011**

(54) METHOD OF CONFIGURING A KEYPAD OF A LOAD CONTROL SYSTEM

(75) Inventors: Matthew Joseph Swatsky, Macungie, PA (US); Galen Edgar Knode, Macungie, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 1249 days.

This patent is subject to a terminal disclaimer.

(21) Appl. No.: 11/800,296

(22) Filed: May 4, 2007

(65) Prior Publication Data

US 2008/0136683 A1 Jun. 12, 2008

Related U.S. Application Data

(63) Continuation-in-part of application No. 11/636,095, filed on Dec. 8, 2006, now Pat. No. 7,796,057.

(51) Int. Cl.
*H03M 11/00* (2006.01)

(52) U.S. Cl. .............. 341/23; 341/20; 341/22; 345/168; 200/5 A; 200/310; 200/314; 166/331

(58) Field of Classification Search .................... 341/20, 341/22, 26; 345/168; 200/5 A, 310, 314; 160/331
See application file for complete search history.

(56) References Cited

U.S. PATENT DOCUMENTS

| | | | |
|---|---|---|---|
| 5,191,265 | A | 3/1993 | D'Aleo et al. |
| 5,463,286 | A | 10/1995 | D'Aleo et al. |
| 5,530,322 | A | 6/1996 | Ference et al. |
| 6,380,696 | B1 | 4/2002 | Sembhi et al. |
| 6,545,434 | B2 | 4/2003 | Sembhi et al. |
| 6,803,728 | B2 | 10/2004 | Balasubramaniam et al. |
| 6,983,783 | B2 | 1/2006 | Carmen, Jr. et al. |
| 7,190,125 | B2 | 3/2007 | McDonough et al. |
| 7,361,853 | B2 | 4/2008 | Clegg et al. |
| 7,414,210 | B2 | 8/2008 | Clegg et al. |
| 7,432,460 | B2 | 10/2008 | Clegg et al. |
| 7,432,463 | B2 | 10/2008 | Clegg et al. |
| 2003/0015302 | A1 | 1/2003 | Pessina et al. |
| 2005/0102040 | A1 | 5/2005 | Kruse et al. |
| 2005/0137720 | A1 | 6/2005 | Spira et al. |
| 2008/0136680 | A1 | 6/2008 | Swatsky et al. |

OTHER PUBLICATIONS

Lutron Electronics Co Inc., Radio RA Wireless Central Lighting Control Setup Guide, Dec. 2000, 52 pages.
Lutron Electronics Co Inc., seeTouch Window Treatment Wallstations Installation Instructions, Jun. 2002, 8 pages. Lutron Electronics Co Inc., seeTouch Grafik Systems Sivoia Controller Installation Instructions, Oct. 2002, 10 pages.
Lutron Electronics Co., Inc., Application Note #7: Sivoia QED Multigroup Keypads, Apr. 2005, 2 pages.
European Patent Office, International Search Report and Written Opinion for International Patent Application No. PCT/US2007/085786, May 8, 2008, 11 pages.

*Primary Examiner* — Albert Wong
(74) *Attorney, Agent, or Firm* — Mark E. Rose; Philip N. Smith

(57) ABSTRACT

A load control system is operable to control the amount of power delivered to a plurality of electrical loads from an AC power source. The load control system includes a plurality of keypads, which each may include a different button assembly having a different button configuration or multiple button configurations. Each keypad is operable to determine the button configuration of the button assembly installed on the keypad in response to simultaneous actuations of the top button and the bottom button of the button assembly for a predetermined amount of time. Each keypad is further operable to store in a memory of the keypad data representing the button configuration. Therefore, after the keypad is installed in the field and the button assembly is replaced, the keypad can be easily configured to operate with the new button assembly.

14 Claims, 14 Drawing Sheets

METHOD OF CONFIGURING A KEYPAD OF A LOAD CONTROL SYSTEM

RELATED APPLICATIONS

This application is a continuation-in-part of commonly-assigned U.S. patent application Ser. No. 11/636,095, filed Dec. 8, 2006 now U.S. Pat. No. 7,796,057, entitled METHOD OF CONFIGURING A KEYPAD OF A LOAD CONTROL SYSTEM, the entire disclosure of which is hereby incorporated by reference.

BACKGROUND OF THE INVENTION

1. Field of the Invention

The present invention relates to a keypad of a load control system for controlling the amount of power delivered to a plurality of electrical loads from an AC power source, and more particularly, to a method of easily configuring a keypad of a load control system with a new button configuration or multiple button configurations.

2. Description of the Related Art

Typical load control systems are operable to control the amount of power delivered to an electrical load, such as a lighting load or a motor load, from an alternating-current (AC) power source. A load control system generally comprises a plurality of control devices coupled to a communication link to allow for communication between the control devices. The load control system includes load control devices operable to control the amount of power delivered to the loads in response to digital messages received via the communication link or from local inputs, such as user actuations of a button. Further, the load control system often includes one or more keypads, which transmit commands across the communication link to control the loads coupled to the load control devices. An example of a lighting control system is described in greater detail in commonly-assigned U.S. Pat. No. 6,803,728, issued Oct. 12, 2004, entitled SYSTEM FOR CONTROL OF DEVICES, the entire disclosure of which is hereby incorporated by reference.

FIG. 1 is a simplified block diagram of a prior art lighting control system 10. The lighting control system 10 comprises a multi-zone lighting control unit 12 coupled between an AC power source 14 and a plurality of lighting loads 16 to individually control the amount of power delivered to, and thus the intensity of, each of the lighting loads. The multi-zone lighting control unit 12 may comprise, for example, a GRAFIK Eye® Control Unit, which is manufactured by the assignee of the present invention. The lighting control unit 12 is coupled to a communication link 18, which enables the lighting control unit to communicate with a plurality of keypads, e.g., a two-button (2B) keypad 20 and a four-scene (4S) keypad 30. The communication link 18 may be implemented as, for example, a four-wire RS-485 communication link. Each of the keypads 20, 30 is configured with a unique identifier, i.e., a unique address. Accordingly, the lighting control unit 12 is operable to transmit digital messages to the keypads using the unique addresses of the keypads. The lighting control system 10 may also comprise additional keypads, which may each have a different number of buttons at different locations on the respective front surfaces of the keypads.

FIGS. 2A and 2B are front views of the 2B keypad 20 and the 4S keypad 30. The 2B keypad 20 includes a faceplate 22 and two buttons 24A, 24B. Two visual indicators 26A, 26B, e.g., light-emitting diodes (LEDs), are located adjacent to the two buttons 24A, 24B, respectively, and provide feedback of the status of the lighting loads 16. The 2B keypad 20 may be configured with different button functionalities. For example, the buttons 24A, 24B may be configured such that an actuation of the first button 24A selects a first lighting preset (or "scene") of the lighting control unit 12, while an actuation of the second button 24B selects a second lighting preset. Accordingly, the visual indicators 26A, 26B illuminate to indicate if the first lighting preset or the second lighting preset is selected. Alternatively, the 2B keypad 20 may be configured such that actuations of the first and second buttons 24A, 24B raise and lower the intensities of the lighting loads 16, start and stop a sequence of the lighting control unit 12, or select third and fourth lighting presets. The buttons 24A, 24B may be engraved with icons or text that are descriptive of the functions that are performed by actuations of the buttons.

Referring to FIG. 2B, the 4S keypad 30 includes a faceplate 32, four scene-selection buttons 34A, 34B, 34C, 34D, an off button 38, a raise button 39A, and a lower button 39B. Actuations of the first, second, third, and fourth buttons 34A, 34B, 34C, 34D select first, second, third, and fourth lighting presets, respectively. The 4S keypad 30 includes four visual indicators 36A, 36B, 36C, 36D, which are located next to the four buttons 34A, 34B, 34C, 34D, respectively, and illuminate to indicate whether the first, second, third, or fourth lighting preset is selected. An actuation of the off button 38 causes the lighting control unit 12 to select an off scene, i.e., one in which all of the lighting loads 16 are turned off. Actuations of the raise button 39A and the lower button 39B cause the lighting control unit 12 to respectively raise and lower the intensities of the lighting loads 16. The 4S keypad 30 may be alternatively configured such that, for example, the buttons 34A, 34B, 34C, 34D select fifth, sixth, seventh, and eighth lighting presets.

In order for the lighting control unit 12 to be responsive to the 2B keypad 20 or the 4S keypad 30, each keypad must be associated with the lighting control unit. FIG. 3 is a flowchart of a prior art association procedure 80 for associating a keypad with the lighting control unit 12. First, a user simultaneously presses and holds the top and bottom buttons on one of the keypads for three (3) seconds to enter a programming mode at step 82. For example, the user can simultaneously press and hold the first button 24A and the second button 24B on the 2B keypad 20, or the first button 34A and the off button 38 on the 4S keypad 30. Accordingly, the keypad enters the programming mode and cycles the visual indicators, i.e., individually illuminates each of the visual indicators in sequence, at step 84. At step 86, the user presses the top scene button 12A on the lighting control unit to associate the lighting control unit 12 with the keypad. At step 88, the lighting control unit 12 stores the address of the keypad in memory, so that the lighting control unit 12 is now responsive to actuations of the buttons of the keypad. At step 90, the lighting control unit 12 flashes the column of visual indicators 12B in unison to indicate that the association has been made. Finally, the user simultaneously presses and holds the top and bottom buttons on the keypad for three (3) seconds at step 92, and the keypad exits the programming mode at step 94.

FIG. 4A is an exploded perspective view of the 4S keypad 30, and FIG. 4B is a front view of a base unit 40 of the 4S keypad. While the exploded view of FIG. 4A shows the 4S keypad 30, the 2B keypad 20 has a similar assembly. The base unit 40 houses the electrical circuitry of the 4S keypad 30, which is preferably mounted on a printed circuit board (not shown). A button assembly 42 includes the buttons 34A-39B and snaps to the base unit 40, such that the buttons are operable to actuate tactile switches 44A-44I mounted on the printed circuit board inside the base unit. The base unit 40 provides seven vertically arranged tactile switches 44A-44G, such that the button assembly 42 can include up to seven vertically arranged scene-selection buttons. Alternatively, the lower most of the seven scene-selection buttons can be replaced with the raise and lower buttons 39A, 39B, which actuate the tactile switches 44H, 44I. Accordingly, a plurality of different combinations, i.e., different button configurations, may be provided on the button assembly 42.

Preferably, a plurality of backlights, e.g., LEDs (not shown), are mounted on the printed circuit board immediately behind the buttons. The backlights illuminate the buttons, such that text or icons that may be engraved on the buttons can be easily read in a dark room. The base unit 40 illuminates only the buttons that are provided on the button assembly 42, i.e., per the present button configuration of the keypad. The base unit 40 does not illuminate the backlight behind the bottom button when the raise and lower buttons 39A, 39B are provided on the button assembly 42.

A faceplate adapter 46 attaches to the base unit 40 via two screws 48. The faceplate 32 snaps to the faceplate adapter 46, such that the buttons extend through openings 50 of the faceplate. The 4S keypad 30 is adapted to be mounted in a standard electrical wallbox (not shown) via two mounting screws 52 and two mounting holes 54.

The 4S keypad 30 further comprises a dual-inline package (DIP) switch 56, which is mounted on the printed circuit board and is accessible to a user of the keypad through an opening 58 in the base unit 40. When the 4S keypad 30 is fully assembled, the DIP switch 56 is hidden from view by the button assembly 42. The DIP switch 56 includes a plurality of maintained switches, e.g., ten (10) switches, which are used to set the unique address of the 4S keypad 30 or the 2B keypad 20. The individual switches of the DIP switch 56 are either open or closed in a binary fashion to set the address. For example, the switches may be closed to indicate a logic one (1) and opened to indicate a logic zero (0). If six of the individual switches of the DIP switch 56 are used to set the address, the address may range from zero (0) to sixty-three (63), i.e., $2^6-1$. An address of five (5) corresponds to setting the individual switches of the DIP switch 56 to 000101.

Further, the switches of the DIP switch 56 are used to set the button functionality (i.e., the functions that are selected by actuations of the buttons) and the button configuration (i.e., the number and arrangement of buttons that are provided on the button assembly 42). The base unit 40 determines which backlights to illuminate and which visual indicators to control depending upon the present button configuration. The faceplate 32 and the button assembly 42 are adapted to be removed from the 4S keypad 30 after the keypad has been shipped and installed in the field. A user may change the faceplate and the button assembly of a keypad in the field, for example, from a 4S keypad 30 to a 2B keypad 20. Because the switches of the DIP switch 56 are used to dictate the button configuration of the keypad, the individual switches of the DIP switch 56 must be changed when the button assembly 42 is changed.

Since the individual switches of the DIP switch 56 tend to be rather small and difficult to access, the process of setting the DIP switches 56 in order to configure each of the keypads can be challenging. Accordingly, the keypads may be configured incorrectly. For example, two keypads may be configured with the same address, which causes communication errors and unreliable system operation. Also, in order to change the button functionality or the button configuration, the user must remove the faceplate and the button assembly 42 to access the DIP switch 56, and must refer to a user guide in order to determine the appropriate positions of the individual switches of the DIP switch 56 to achieve the desired functionality or configuration.

Accordingly, there exists a need for a method of easily and accurately configuring a keypad, particularly when changing the button assembly and faceplate of the keypad.

SUMMARY OF THE INVENTION

According to the present invention, a method of configuring a keypad of a load control system to have first and second button configurations comprises the steps of: (1) mechanically coupling to the keypad a button assembly having first and second button configurations, each button configuration defining a number and arrangement of buttons on the button assembly; (2) simultaneously actuating a first button and a second button of the first button configuration to actuate at least two of a plurality of switches of the keypad for a predetermined amount of time; (3) the keypad detecting that the first button and the second button have been actuated fro the predetermined amount of time; (4) the keypad subsequently storing in a memory a first keypad data representing the first button configuration dependent upon which tactile switches were actuated when the first and second buttons were actuated for the predetermined amount of time; (5) simultaneously actuating a third button and a fourth button of the second button configuration to actuate at least two other switches of the keypad for the predetermined amount of time after the keypad has stored the first keypad data representing the first button configuration in the memory; (6) the keypad detecting that the third button and the fourth button have been actuated for the predetermined amount of time; and (7) the keypad subsequently storing in a memory a second keypad data representing the second button configuration dependent upon which tactile switches were actuated when the third and fourth buttons were actuated for the predetermined amount of time.

According to another embodiment of the present invention, a method of configuring a keypad for use in a load control system comprises the steps of: (1) installing a first button assembly on the keypad, the first button assembly having a first button configuration defining the number and arrangement of buttons on the first button assembly; (2) the keypad storing in a memory of the keypad a first data representing the first button configuration; (3) removing the first button assembly from the keypad; (4) installing a second button assembly on the keypad, the second button assembly having a second button configuration defining the number and arrangement of buttons on the second button assembly; (5) simultaneously actuating a first button and a second button of the second button assembly to actuate at least two of a plurality of switches of the keypad for a predetermined amount of time; (6) the keypad detecting that the first button and the second button of the second button assembly have been actuated for the predetermined amount of time; (7) the keypad subsequently determining if any of the tactile switches actuated by the buttons between the first button and the second button of the second button assembly were also actuated by the buttons of the first button configuration of the first button assembly; and (8) the keypad storing in the memory of the keypad a second data representing the second button configuration dependent upon which tactile switches were actuated when the first and second buttons were actuated for the predetermined amount of time.

In addition, the present invention provides a method of configuring a keypad having an infrared receiver and a plurality of switches for use in a load control system. The method comprises the steps of: (1) mechanically coupling a button assembly to the keypad; (2) simultaneously actuating a first button and a second button of the button assembly to actuate at least two of the switches of the keypad for a predetermined amount of time; (3) the keypad entering an advanced programming mode in response to the keypad detecting that the first button and the second button have been actuated for the predetermined amount of time; (4) the keypad subsequently receiving an infrared command via the infrared receiver; and (5) the keypad enabling the infrared receiver during normal operation of the keypad.

Other features and advantages of the present invention will become apparent from the following description of the invention that refers to the accompanying drawings.

DETAILED DESCRIPTION OF THE INVENTION

Figure 1:
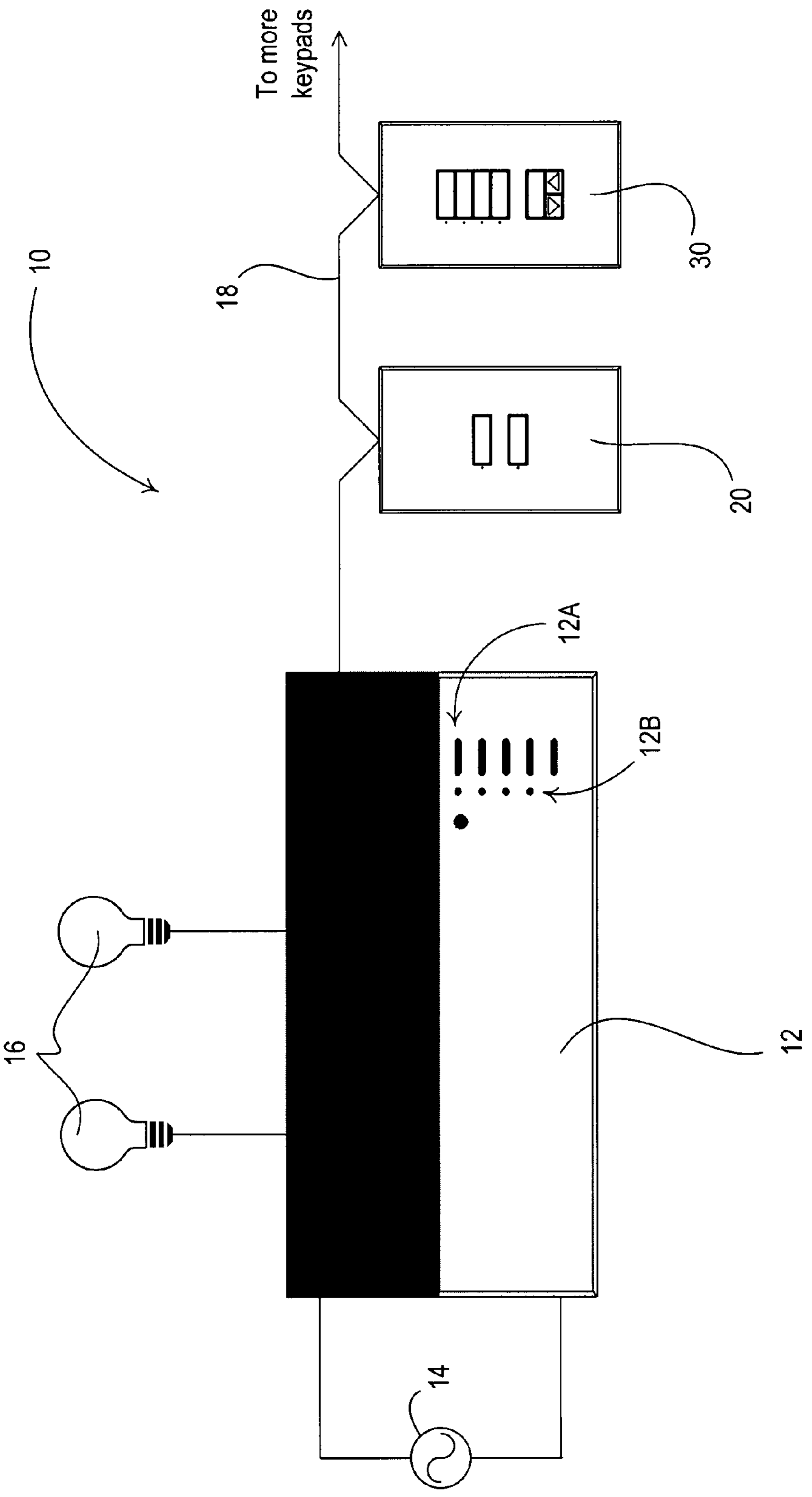
Fig. 1 Prior Art
FIG. 1 is a simplified block diagram of a prior art lighting control system.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

Figure 5:
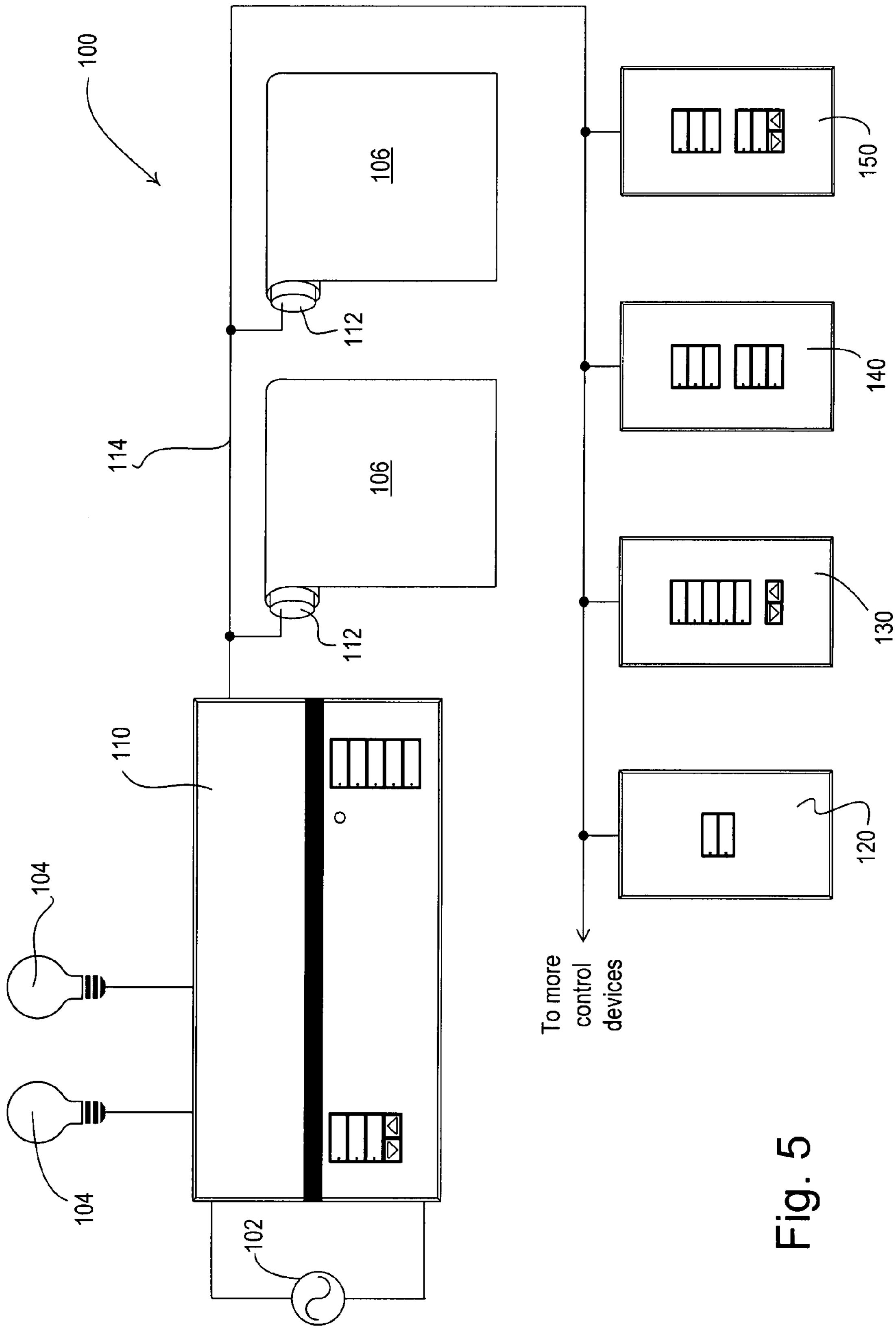
FIG. 5 is a simplified block diagram of a load control system for controlling lighting loads and motorized window treatments from an AC power source.

FIG. 5 is a simplified block diagram of a load control system 100 for control of a plurality of lighting loads 104 and a plurality of motorized window treatments, e.g., motorized roller shades 106, from an AC power source 102. The load control system 100 comprises a multi-zone load control device 110, which comprises integral dimmer circuits for controlling the intensities of the lighting loads 104. Each of the motorized roller shades 106 comprises an electronic drive unit (EDU) 112, which is preferably located inside the roller tube of the roller shade. An example of an electronic drive unit 112 is described in greater detail in commonly-assigned U.S. Pat. No. 6,983,783, issued Jun. 11, 2006, entitled MOTORIZED SHADE CONTROL SYSTEM, the entire disclosure of which is hereby incorporated by reference. The load control device 110 is operable to communicate with the electronic drive units 112 via a communication link 114, which preferably comprises a wired four-wire RS-485 communication link. Alternatively, the communication link 114 may comprise a wireless communication link, such as, for example, a radio-frequency (RF) or an infrared (IR) communication link.

The load control device 110 and the electronic drive units 112 are responsive to digital messages received via the communication link 114 from a plurality of keypads, e.g., a two-button (2B) keypad 120, a five-button raise/lower (5BRL) keypad 130, a dual keypad 140, and a multi-group keypad 150. The user is able to adjust the intensities of the lighting loads 104 or to select a lighting preset of the load control device 110 using the keypads 120, 130, 140, 150. The user is also able to open or close the motorized roller shades 106, adjust the positions of the shade fabrics of the roller shades, or set the roller shades to preset shade positions using the keypads 120, 130, 140, 150. The load control device 110 and the electronic drive units 112 are both operable to be controlled in response to a signal digital message transmitted across the communication link 114. For example, a single preset may include preset lighting intensities and preset shade positions.

Figure 2B:
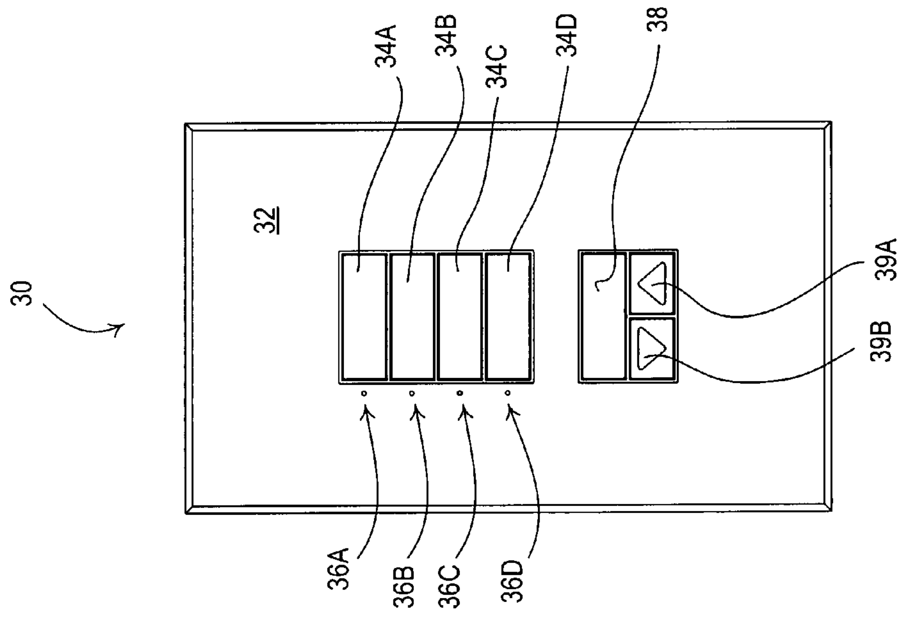
Fig. 2B Prior Art
FIG. 2B is a front view of a four-scene keypad of the lighting control system of FIG. 1.
Figure 2A:
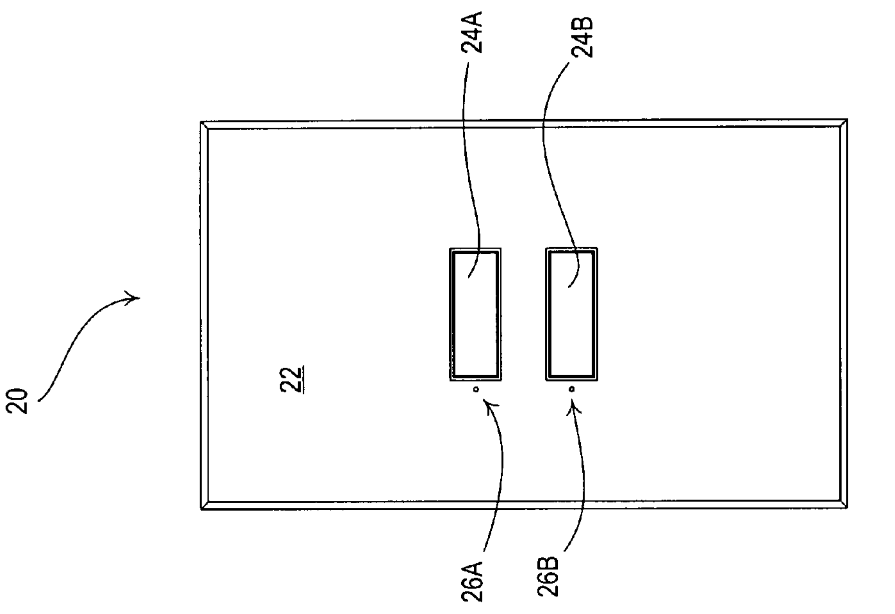
Fig. 2A Prior Art
FIG. 2A is a front view of a two-button keypad of the lighting control system of FIG. 1.
Figure 4A:
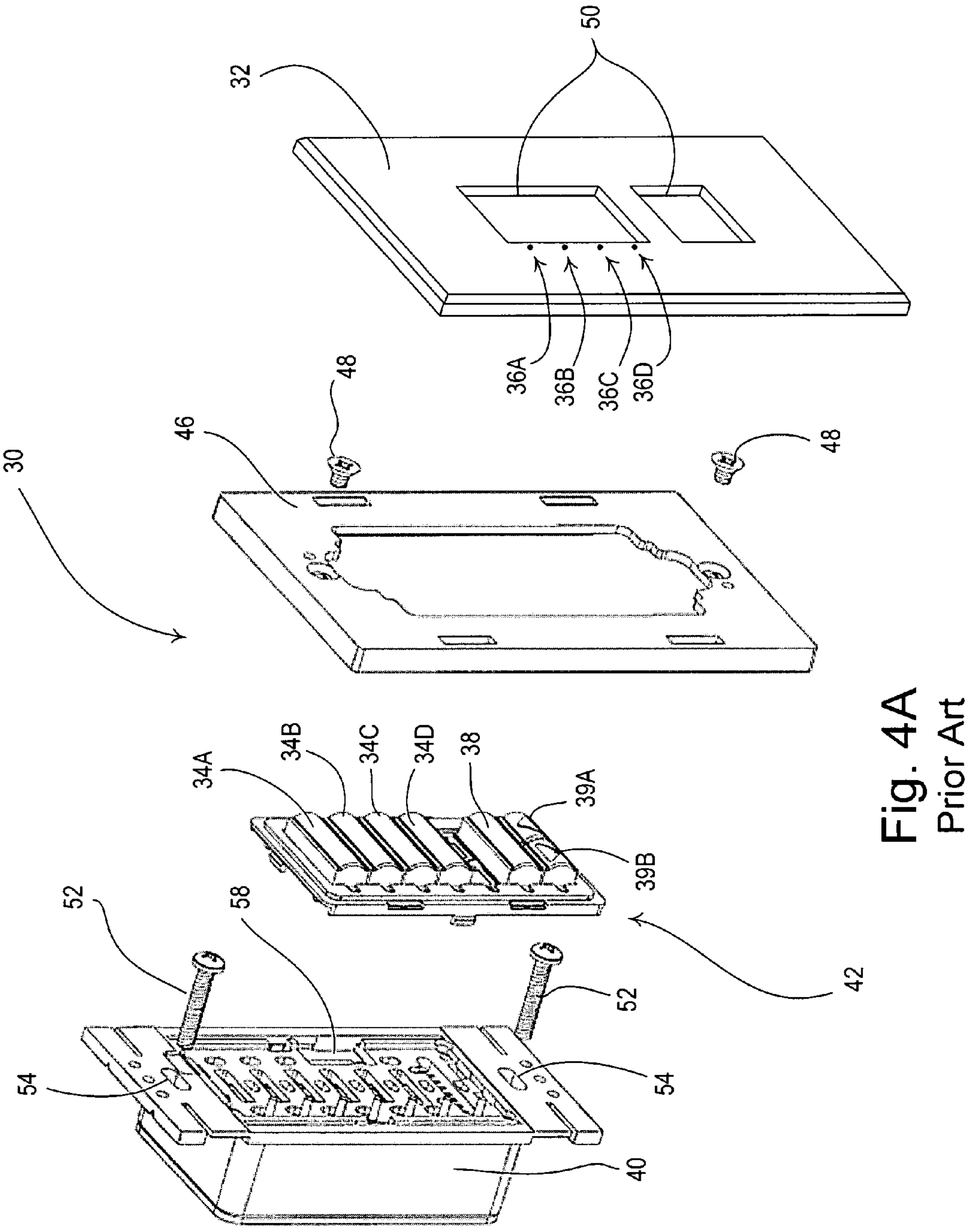
Fig. 4A Prior Art
FIG. 4A is an exploded perspective view of the four-scene keypad of FIG. 2B.

FIGS. 6A, 6B, 6C, and 6D are front views of the 2B keypad 120, the 5BRL keypad 130, the dual keypad 140, and the multi-group keypad 150, respectively. The 2B keypad 120, the 5BRL keypad 130, the dual keypad 140, and the multi-group keypad 150 have similar mechanical structures as that shown in the exploded view shown in FIG. 4A. The 2B keypad 120 comprises two buttons 124A, 124B having visual indicators 126A, 126B (i.e., LEDs) located in the buttons. The 2B keypad 120 provides a similar functionality as the prior art 2B keypad 20 of FIG. 2A.

The 5BRL keypad 130 comprises five scene-selection buttons 134A-134E having visual indicators 136A-136E, respectively. An actuation of any of the scene-selection buttons 134A-134E selects a respective lighting preset of the load control device 110. The visual indicators 136A-136E illuminate to indicate whether the respective lighting preset is selected. In response to an actuation of a raise button 138A and a lower button 138B of the 5BRL keypad 130, the load control device 110 is operable to raise and lower, respectively, the intensities of the lighting loads 104 in unison.

The dual keypad 140 and the multi-group keypad 150 each include multiple button combinations, e.g., two button combinations. The dual keypad 140 includes two groups of buttons having first control buttons 144A, 144B, 144C with corresponding visual indicators 146A, 146B, 146C, and second control buttons 145A, 145B, 145C with corresponding visual indicators 147A, 147B, 147C. Actuations of the first control buttons 144A, 144B, 144C and the second control buttons 145A, 145B, 145C may control two separate groups of lighting loads 104 (e.g., to three different lighting presets each), two separate groups of motorized roller shades 106

(e.g., to open, stop, and close), or a group of lighting load and a group of motorized roller shades.

Figure 6B:
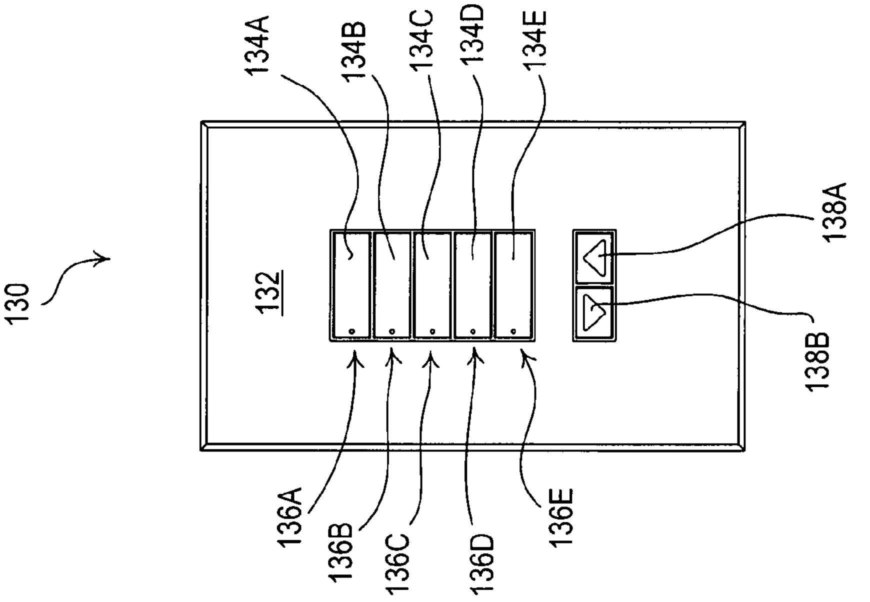
FIG. 6B is a front view of a five-button raise/lower keypad of the load control system of FIG. 5.
Figure 6A:
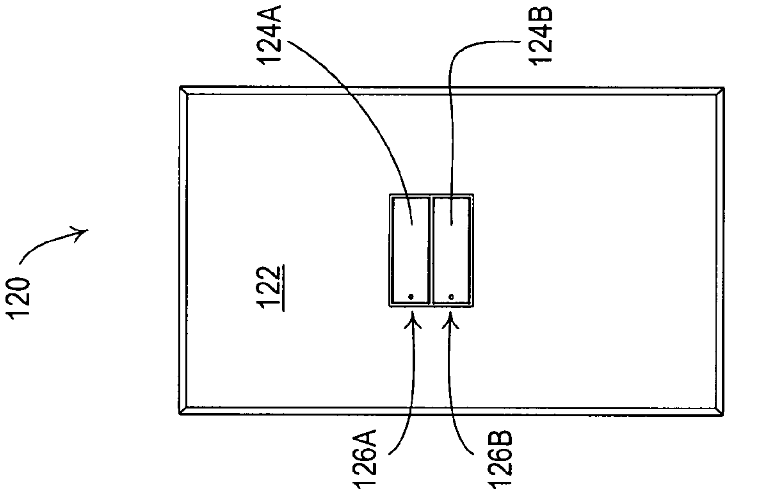
FIG. 6A is a front view of a two-button keypad of the load control system of FIG. 5.
Figure 6D:
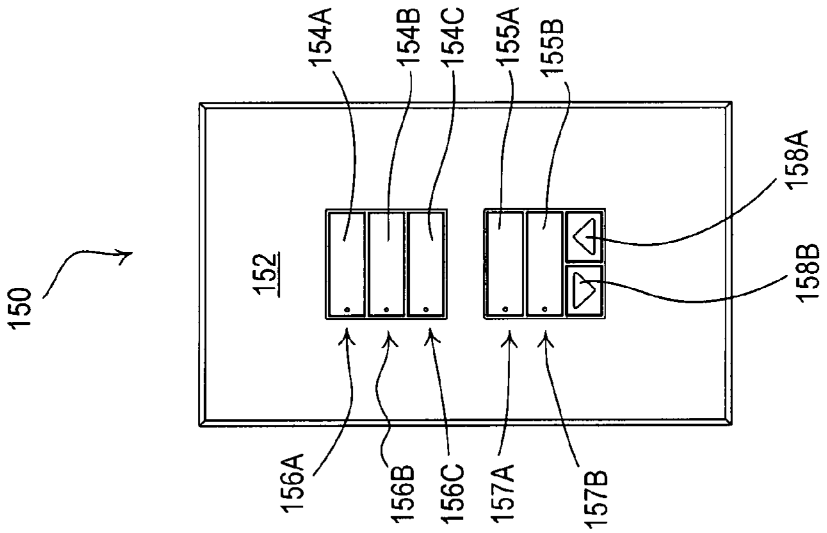
FIG. 6D is a front view of a multi-group keypad of the load control system of FIG. 5.
Figure 6C:
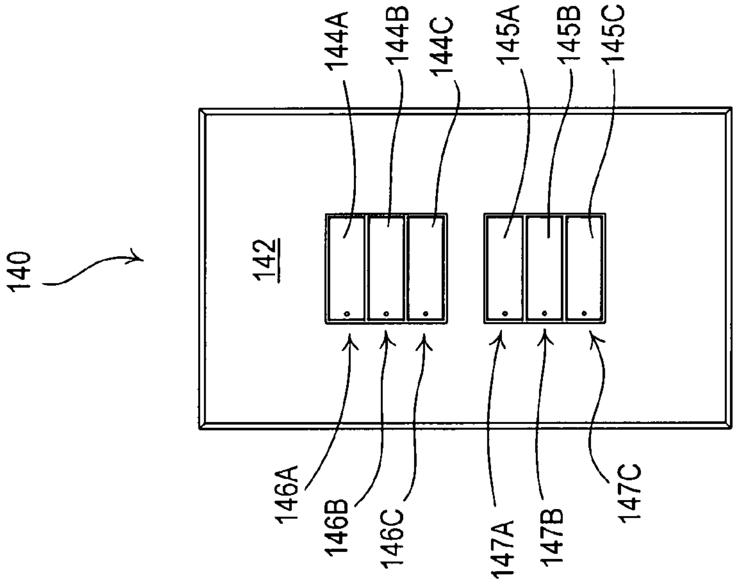
FIG. 6C is a front view of a dual keypad of the load control system of FIG. 5.

The multi-group keypad 150 can independently control three groups of motorized roller shades 106. Referring to FIG. 6D, the multi-group keypad 150 comprises three group-selection buttons 154A, 154B, 154C, two control buttons 155A, 155B, a raise button 158A, and a lower button 158B. An actuation of one of the group-selection buttons 154A, 154B, 154C selects an associated group of motorized roller shades 106. Visual indicators 156A, 156B, 156C illuminate to indicate which group of motorized roller shades 106 is selected. After one of the groups is selected using the group-selection buttons 154A, 154B, 154C, the user is able to actuate the control buttons 155A, 155B, the raise button 158A, and the lower buttons 158B to control the motorized roller shades 106 of the selected group. An actuation of the first control button 155A causes the selected group of motorized roller shades 106 to move to fully-open positions, while an actuation of the second control button 155B causes the selected group of motorized roller shades to move to fully-closed positions. Actuations of the raise button 158A and the lower button 158B cause the selected group of motorized rollers shades 106 to raise and lower, respectively, while the buttons are held. Alternatively, the multi-group keypad 150 could function to control three separate groups of lighting loads 104 or groups of both lighting loads and motorized roller shades 106.

Figure 6E:
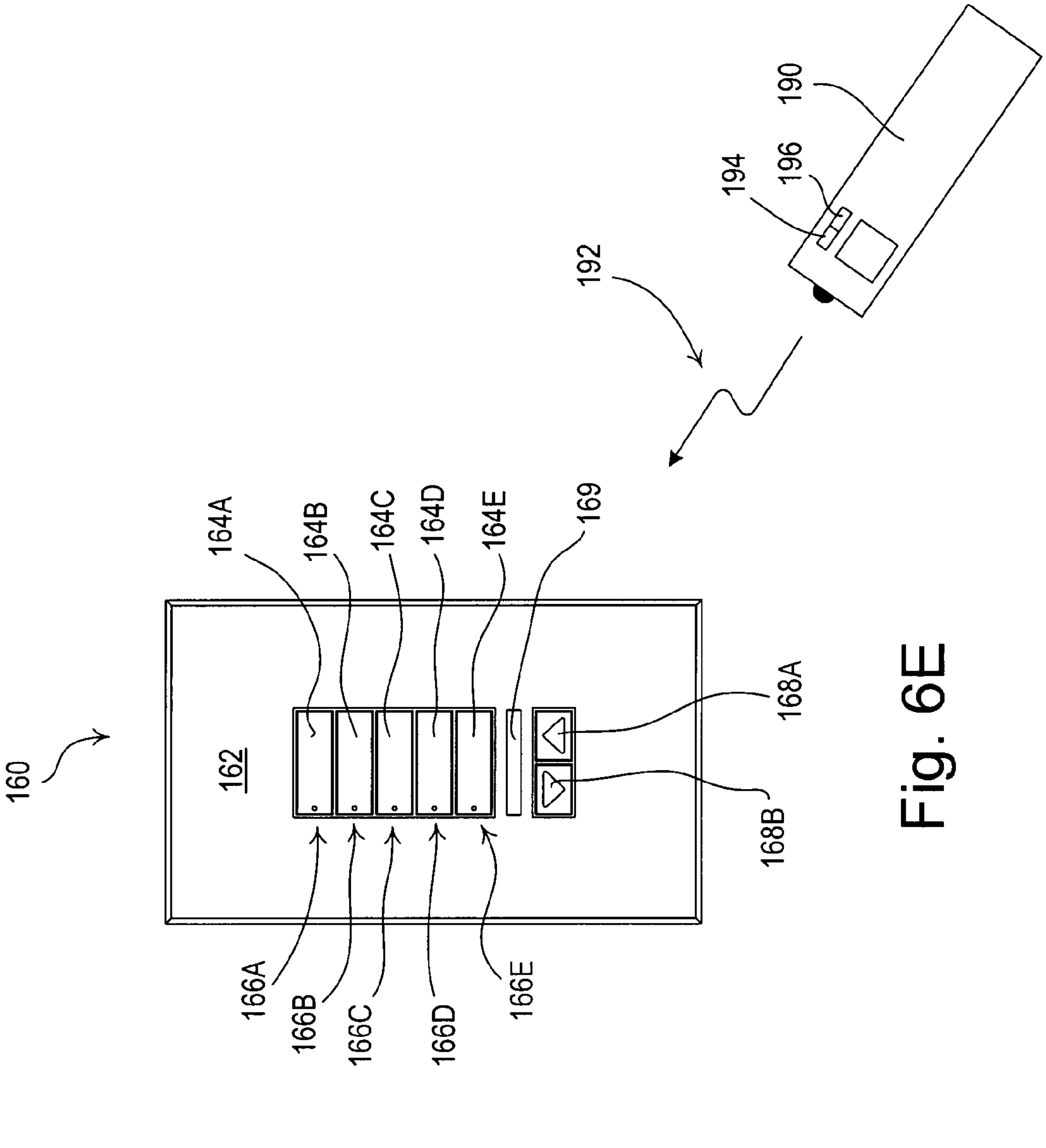
FIG. 6E is a front view of a keypad having an infrared receiving lens.

The load control system 100 may also comprise an IR keypad 160 as shown in FIG. 6E. The buttons and visual indicators of the IR keypad 160 operate in the same manner as those of the 5BRL keypad 130. However, the IR keypad 160 comprises an infrared (IR) lens 169 for receiving IR signals 192 from an IR transmitter 190. The IR transmitter 190 preferably comprises a raise button 194 for transmitting a raise command to the IR keypad 160 and a lower button 196 for transmitting a lower command. For example, during normal operation of the load control system 100, the load control device 110 may increase and decrease the intensities of the lighting loads 104 in response to the IR keypad 160 receiving raise and lower commands, respectively.

Figure 7:
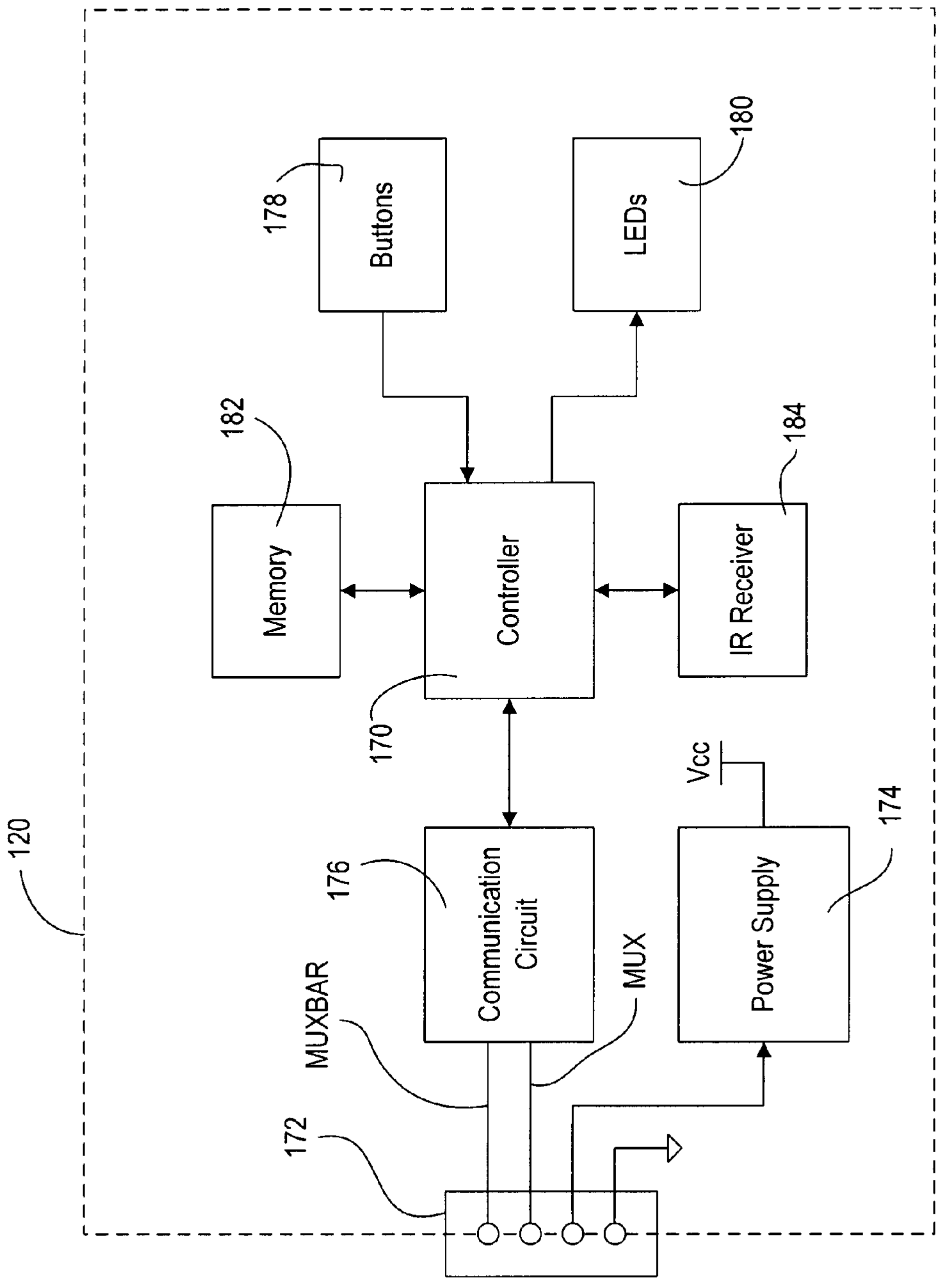
FIG. 7 is a simplified block diagram of the two-button keypad of FIG. 6A.

FIG. 7 is a simplified block diagram of the 2B keypad 120. The 5BRL keypad 130, the dual keypad 140, the multi-group keypad 150, and the IR keypad 160 have equivalent functional blocks. Referring to FIG. 7, the 2B keypad 120 comprises a controller 170, which is preferably implemented as a microprocessor, but may be any suitable processing device, such as, for example, a microcontroller, a programmable logic device (PLD), or an application specific integrated circuit (ASIC). The 2B keypad 120 is coupled to the four-wire communication link 114 via a four-position connector 172. A power supply 174 draws current from one of the conductors of the communication link 114 via the connector 172 and generates a direct-current (DC) voltage Vcc for powering the controller 170 and other low-voltage circuitry of the keypad 120.

A communication circuit 176, e.g., an RS-485 transceiver, is coupled to a first data wire MUX and a second data wire MUXBAR of the communication link 114, which carry differential signals according to the RS-485 protocol. The controller 170 is coupled to the communication circuit 176, such that the controller 170 is operable to transmit and receive digital messages via the communication link 114. The controller 170 also receives inputs from a plurality of buttons 178, e.g., the first and second buttons 124A, 124B, and controls a plurality of LEDs 180, e.g., the first and second visual indicators 126A, 126B.

The keypad 120 further comprises an IR receiver 184 coupled to the controller 160 and operable to receive the IR signals 192 from the IR transmitter 190. When the keypad is installed with the faceplate 162 (as shown in FIG. 6E), the IR lens 169 directs the IR signals 192 to IR receiver 184, such that the controller 170 is operable to respond to the IR signals.

The controller 170 is further coupled to a memory 182 for storage of the configuration information (e.g., the button configuration). The controller 170 is operable to store a single button configuration in the memory 182 (e.g., for the 2B keypad 120 and the 5BRL keypad 130), or multiple (i.e., two) button configurations (e.g., for the dual keypad 140 and the multi-group keypad 150).

Figure 4B:
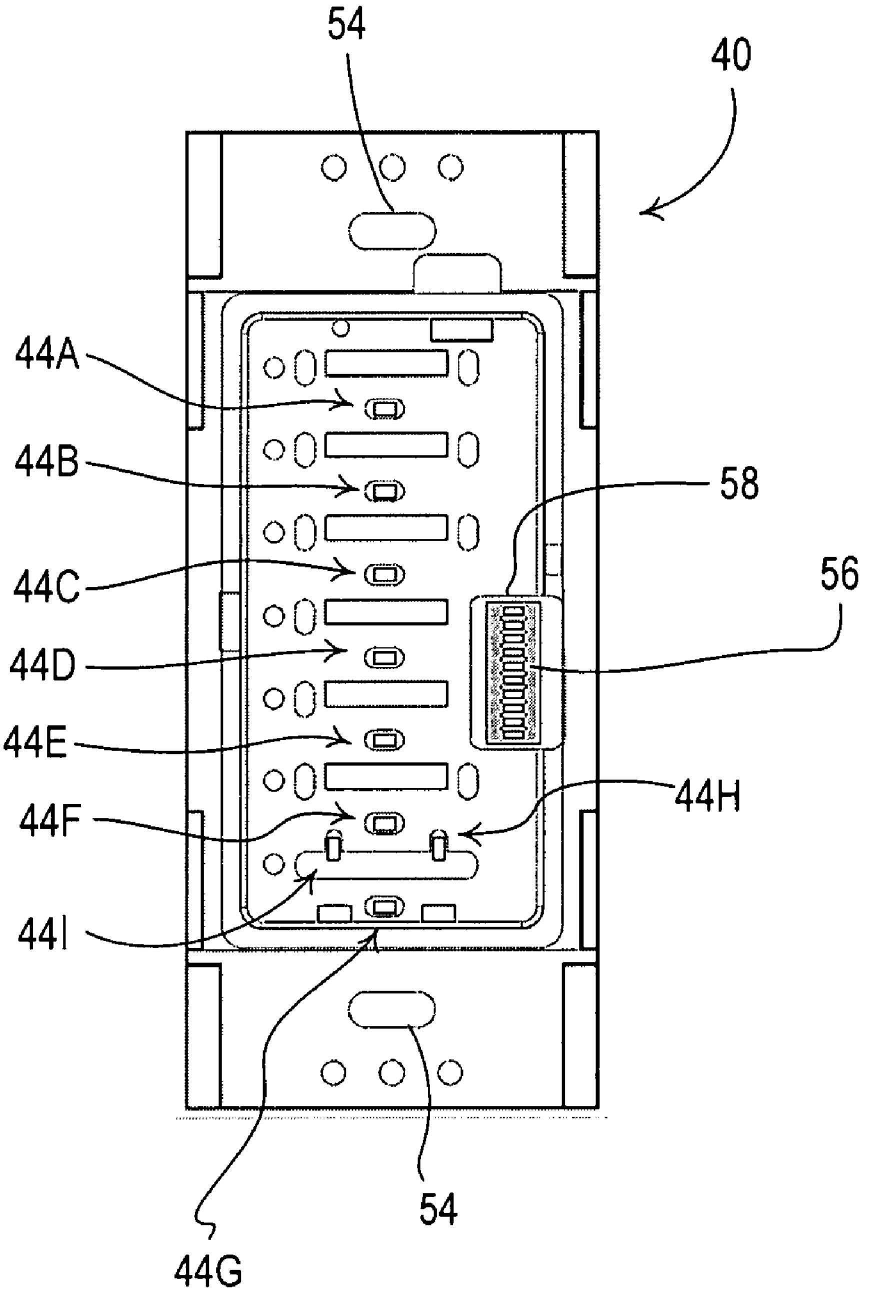
Fig. 4B Prior Art
FIG. 4B is a front view of a base unit of the four-scene keypad of FIG. 4A.

To cause the keypad to enter a standard programming mode, a user presses and holds the top and bottom buttons of the button assembly, e.g., the first button 134A and the fifth button 134E of the 5BRL keypad 130, for a first predetermined amount of time (e.g., three seconds). In the standard programming mode, the user is able, for example, to assign the keypad to the load control device 110 (as in the prior art assignment procedure 80 shown in FIG. 4). In response, the controller 170 stores data representing the assignment in the memory 182.

The 2B keypad 120, the 5BRL keypad 130, the dual keypad 140, and the multi-group keypad 150 do not include a DIP switch for setting the address, the button functionality, and the button configuration. According to the present invention, the keypads are operable to change the programmed button functionality and configuration in response to inputs provided to the controller 170 from the buttons 168. Specifically, the keypads are operable to change the button configuration in response to a simultaneous press and hold of the top and lower buttons of the new button layout for a second predetermined amount of time longer than the first predetermined amount of time (e.g., ten seconds).

Figure 8:
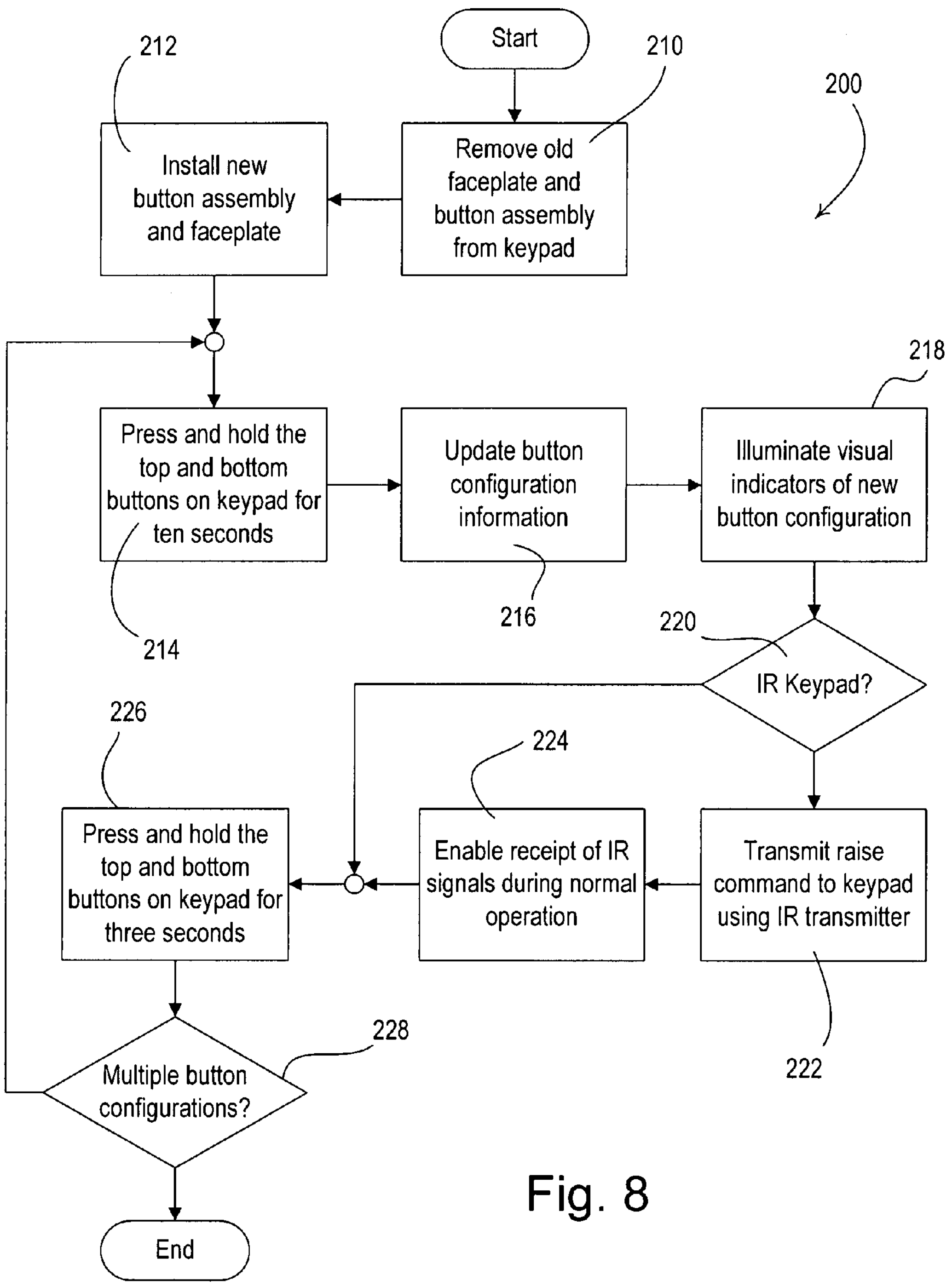
FIG. 8 is a simplified flowchart of a button configuration procedure according to the present invention.

FIG. 8 is a simplified flowchart of a button configuration procedure 200 according to the present invention. First, the user removes the old button assembly and faceplate from the keypad at step 210 and installs the new button assembly and faceplate at step 212. For example, if the user wishes to change a keypad from a 2B keypad 120 to a 5BRL keypad 130, the user first removes the 2B button assembly and faceplate 122, and then installs the 5BRL button assembly and faceplate 130. Next, the user presses and holds the top and bottom buttons of the new button assembly, e.g., the first button 134A and the fifth button 134E, for the second predetermined amount (i.e., ten seconds) of time to enter an advanced programming mode at step 214. Accordingly, the controller 170 of the keypad updates the button configuration information in the memory 182 at step 216, and blinks the visual indicators of the new button configuration at step 218.

If the new button assembly has an IR lens (e.g., the IR lens 169 of the IR keypad 160) at step 220, the user points the IR transmitter 190 at the IR lens of the keypad and actuates the raise button 194 on the IR transmitter to transmit a raise command to the keypad at step 222. The controller 170 of the keypad receives the raise command via the IR receiver 174 and enables the keypad to receive IR signals 192 during normal operation at step 224. If the new button assembly does not have an IR lens at step 220 or after the receipt of IR signals 192 has been enabled at step 224, the user is then able to press and hold the top and bottom buttons for a third predetermined amount of time (e.g., three seconds), at step 226 to exit the advanced button programming mode.

If the new button assembly has multiple button configurations (i.e., the button assembly is being changed from a 2B keypad 120 to a dual keypad 140) at step 228, the procedure 200 loops to allow the user to program another button configuration at steps 214, 216, and 218. For example, the first time that step 214 is executed, the user presses and holds the top and bottom buttons of the first button configuration of the new button assembly, e.g., the first control button 144A and the third control button 144C of the upper group of buttons of the dual keypad 140, for ten seconds to configure the first button configuration. The second time that step 214 is executed, the user presses and holds the top and bottom buttons of the second button configuration of the new button assembly, e.g., the first control button 145A and the third control button 145C of the lower group of buttons, for ten seconds to configure the second button configuration.

Figure 9:
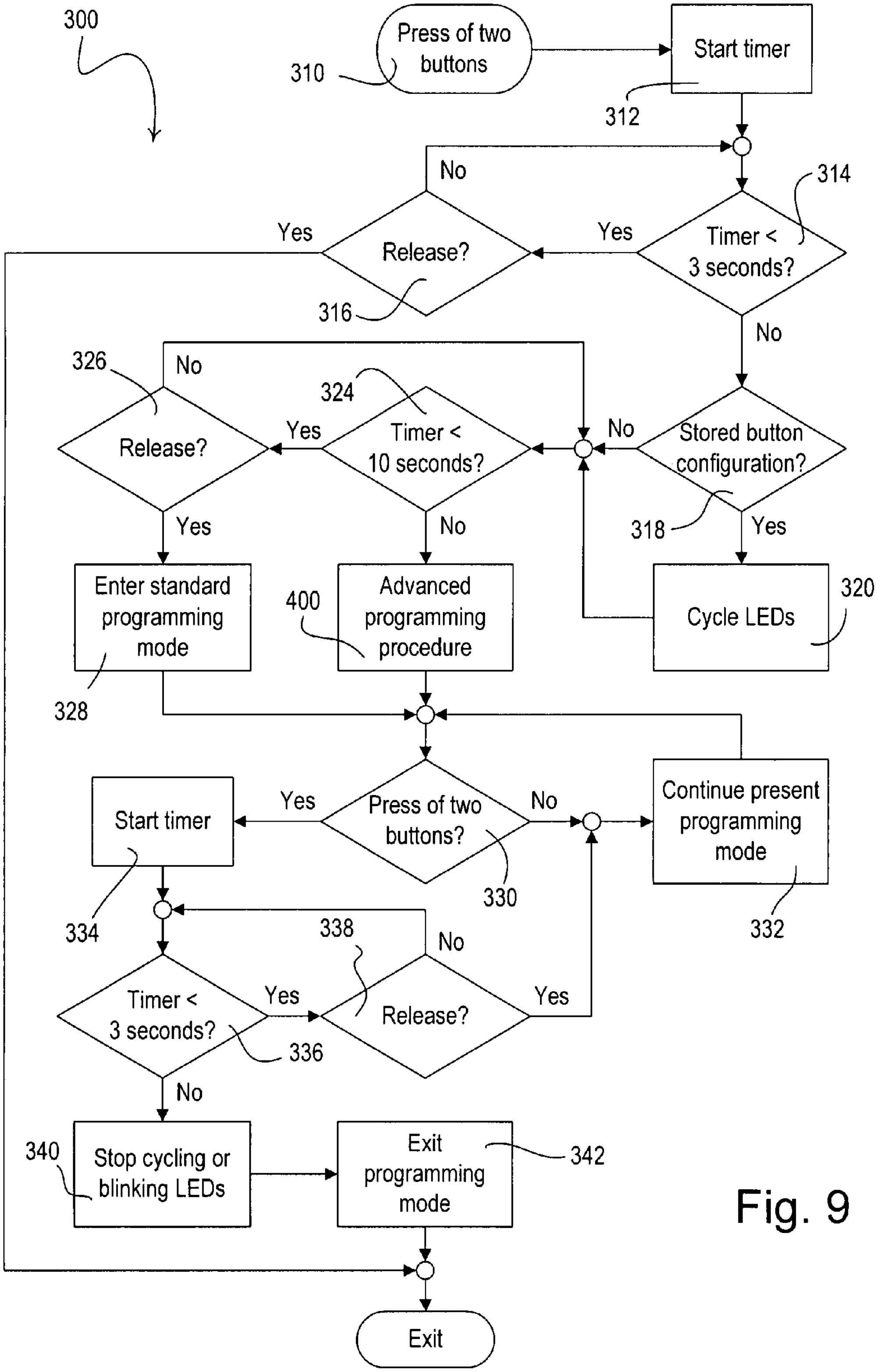
FIG. 9 is a simplified flowchart of a programming procedure executed by a controller of the keypad of FIG. 7 during the button configuration procedure of FIG. 8.

FIG. 9 is a simplified flowchart of a programming procedure 300 executed by the controller 170 during the button configuration procedure 200. The programming procedure 300 begins when the controller 170 detects that the user is simultaneously pressing two buttons at step 310. At step 312, the controller 170 initializes a timer to zero and starts the timer. The controller uses the timer to determine how long the user has pressed the buttons. If the time is less than the first predetermined amount of time (i.e., three seconds) at step 314 and the buttons have not yet been released at step 316, the procedure 300 loops. If one or both of the buttons are released at step 316, the procedure 300 simply exits.

If the user holds the buttons for more than three seconds at step 314, a determination is made at step 318 as to whether the user is pressing the top and bottom buttons of a button configuration that is presently stored in the memory 182. For example, if the first button 134A and the fifth button 134E of the 5BRL keypad 130 are being pressed, the controller 170 determines at step 318 whether one of the button configurations stored in the memory 182 is for the 5BRL keypad 130. Alternatively, if the first control button 145A and the third control button 145C of the lower group of buttons of the dual keypad 140 are being pressed, the controller 170 determines at step 318 whether one of the button configuration stored in the memory 182 is for the dual keypad 140. If the button configuration is stored in the memory 182 at step 318, the controller 170 begins to cycle the appropriate LEDs 180 (i.e., illuminate one-by-one the visual indicators of the button configuration) at step 320.

Figure 3:
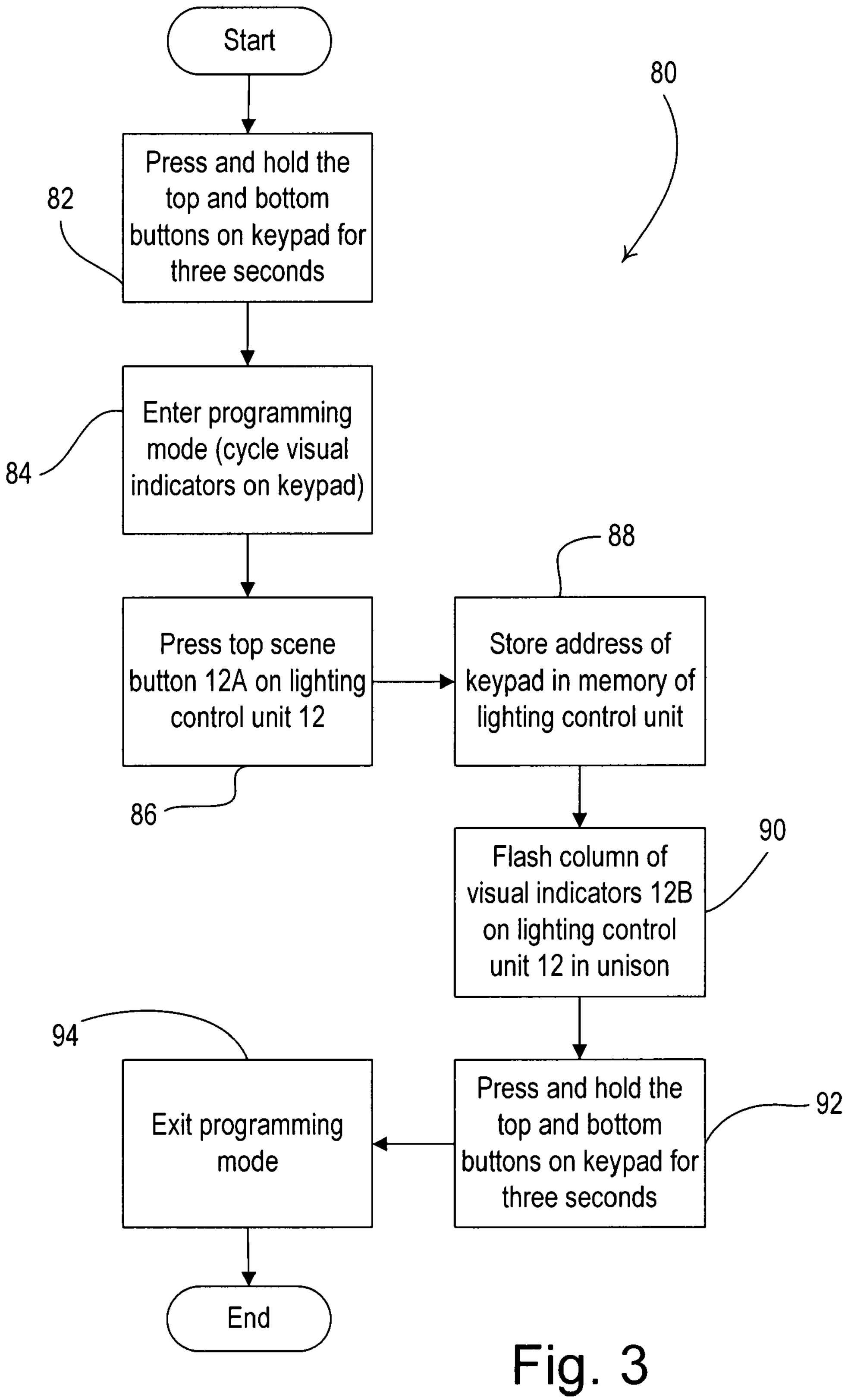
Fig. 3 Prior Art
FIG. 3 is a flowchart of an association procedure for associating a keypad with the lighting control of FIG. 1.

Independent of whether the button configuration is stored in the memory 182 at step 318, the procedure 300 now continues on to determine if the buttons have been held for the second predetermined amount of time (i.e., ten seconds). Specifically, the procedure 300 loops until the timer exceeds ten seconds at step 324 or the buttons are released at step 326. If the buttons are released at step 326, the keypad enters at step 328 the standard programming mode, in which the user may, for example, associate the keypad with the load control device 110 in a similar fashion as the association procedure 80 shown in FIG. 3. However, if the user does not release the buttons before the timer exceeds ten seconds at step 324, the controller 170 executes an advanced programming procedure 400.

Figure 10:
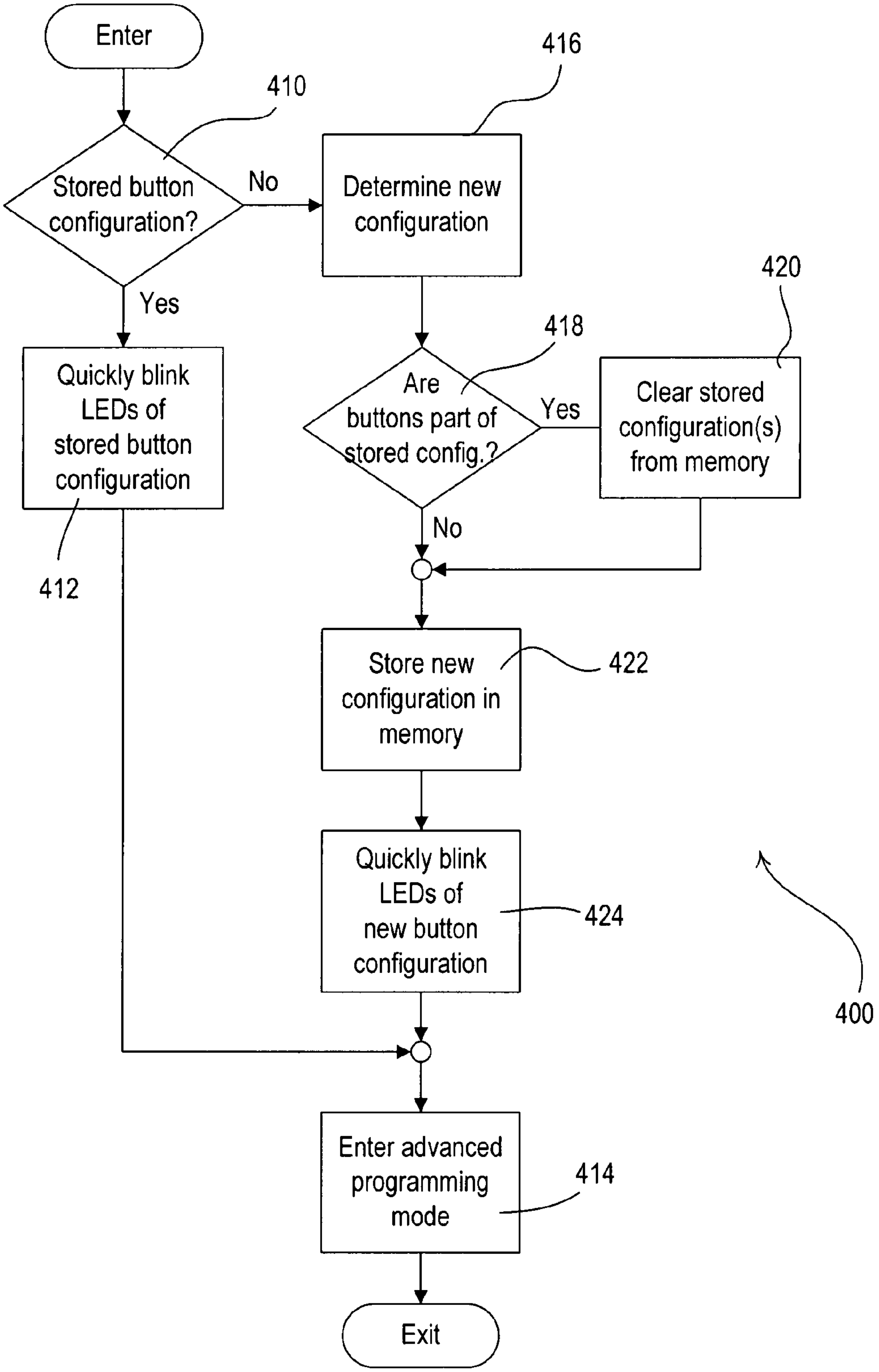
FIG. 10 is a simplified flowchart of an advanced programming procedure executed by the controller of the keypad of FIG. 7 according to the present invention.

FIG. 10 is a simplified flowchart of the advanced programming procedure 400 according to the present invention. If the pressed buttons correspond to a button configuration that is presently stored in the memory 182 at step 410, the controller 170 begins to quickly blink the appropriate LEDs 180 of the stored button configuration at step 412 and enters the advanced button programming mode at step 414. In the advanced button programming mode, the user may, for example, determine the functionality of the buttons, i.e., that function that is selected when the buttons are actuated. The advanced button programming mode is described in greater detail below. After entering the advanced button programming mode at step 414, the procedure 400 exits.

If the pressed buttons do not correspond to a button configuration that is presently stored in the memory 182 at step 410, the controller 170 determines at step 416 the new button configuration from the buttons that were pressed. For example, if the present button configuration is a 2B keypad, but the user presses and holds the top and bottom buttons 134A, 134E of the 5BRL button assembly (i.e., corresponding to the first and fifth tactile switches 44A, 44E of the base unit 40), the controller 170 determines that the new button configuration is that of the 5BRL keypad since the first and fifth tactile switches 44A, 44E were actuated. If the buttons of the new button configuration (i.e., any of the buttons between the top and bottom buttons of the button configuration) are part of one or more of the button configurations stored in the memory 182 at step 418, the controller 170 clears the previous button configurations from the memory 182 at step 420 and stores data representing the new button configuration (from step 416) in the memory 182 at step 422. If the buttons of the new button configuration are not part of one or more of the button configurations stored in the memory 182 at step 418, the controller 170 simply stores the data representing the new button configuration in the memory 182 at step 422. Therefore, multiple button configurations that do not overlap may be stored in the memory 182. At step 424, the controller 170 beings to quickly blink the LEDs 180 of the new button configuration (e.g., the visual indicators 136A-136E of the 5BRL button assembly). Finally, the controller 170 enters the advanced button programming mode at step 414 and the procedure 400 exits.

Referring back to FIG. 9, when the keypad is in the standard programming mode or the advanced button programming mode, the user must simultaneously press and hold the top and bottom buttons of the present button configuration (i.e., those used to enter the programming mode) in order to exit the present programming mode. If these buttons are not being pressed at step 330, the controller 170 continues in the present programming mode at step 332. However when these buttons are pressed at step 330, the timer is initialized to zero and started at step 334. The programming procedure 300 then loops until the timer reaches the third predetermined amount of time (i.e., three seconds) at step 336, or the buttons are released at step 338. If the buttons are released at step 338, the keypad continues in the present programming mode at step 332. When the buttons are pressed and held until the timer exceeds three seconds at step 336, the controller 170 stops cycling or blinking the LEDs 180 according the present programming mode at step 340. The controller 170 then exits the present programming mode at step 342 and the programming procedure 300 exits.

The load control system 100 may include a plurality of keypads, which each may have a different button configuration. The keypads may each include up to seven scene-selection buttons or alternatively up to six scene-selection buttons and both a raise button and a lower button. Preferably, the keypads that are provided for the load control system 100 include buttons that are grouped together (i.e., as with the five scene-selection buttons 134A-134E of the 5BRL keypad 130 shown in FIG. 6B). Further, the keypads are preferably provided such that when the number of buttons on two keypads differ, the tactile switches that the top and bottom buttons actuate are also different for the two keypads. For example, the 2B keypad 120 has top and bottom buttons 124A, 124B that actuate the tactile switches 44C, 44D of the base unit 40, while the 5BRL keypad 130 has top and bottom buttons 134A, 134E that actuate the tactile switches 44A, 44E. Therefore, the controller 170 is able to distinguish the number of buttons that are provided for the new button configuration at step 416 of the advanced programming procedure 400 of FIG. 10, i.e., when the user presses and holds the top and bottom buttons of the button assembly.

Some keypads are provided with a raise button and a lower button. For example, the 5BRL keypad 130 has the raise button 138A and the lower button 138B, while a five-button (5B) keypad (not shown) may only comprise the five scene-selection buttons 134A-134E. The programming procedure 300 for both the 5BRL keypad 130 and the 5B keypad are the same. The user presses and holds the top button 134A and the bottom button 134E for ten seconds in order to update the button configuration. The controller 170 does not need to know that the raise button 138A and the lower button 138B are not provided on the button assembly for the 5B keypad. Since these buttons are not provided on the button assembly, the controller never receives inputs from the tactile switches 44H, 44I, which are actuated by the raise button 138A and the lower button 138B.

Some keypads have button configurations that cannot be updated by simply pressing and holding the top and bottom buttons on the button assembly for ten seconds. For example, since the multi-group keypad 150 has an advanced functionality (i.e., to control the movement of one of three groups of motorized roller shades 106), the user must use the advanced button programming mode to correctly configure both groups of buttons of the multi-group keypad.

The advanced button programming mode provides a plurality of "menus" of options to setup the button functionality and button configuration. The advanced button programming mode may provide a "column menu", from which the user can select the desired functionality and/or configuration of the column of buttons on the keypad. For example, the user can select whether the actuations of the buttons should select lighting presets of the load control device 110 or preset shade positions of the electronic drive units 112, or should operate as the multi-group keypad 150. Further, the advanced button programming mode may provide an "LED menu" (from which the user can enable and disable the backlights) and a "shade menu" (from which the user can select how the electronic drive units 112 operate in response to actuations of the buttons). The menus and options that are provided are dependent upon the present button configuration of the keypad. The controller 170 communicates the different menus and options to the user by illuminating or flashing different LEDs, for example, the user may flash a first LED to indicate that the column menu is selected or flash a second LED to indicate that the button menu is selected.

To navigate to the different menus, the user double-taps the top button (i.e., presses the top button with two transitory actuations in quick succession) to move to the next menu option and double-taps the bottom button to move to the previous menu. To select the current menu, the user presses and holds any button for a predetermined amount of time. The user can then simply press buttons to select and deselect the different options of the current menu. Preferably, an advanced programming mode user guide is provided to the user to assist in the selection of button functionality and configuration options of the keypad. An advanced programming mode for a wall-mounted dimmer is described in greater detail in commonly-assigned U.S. Pat. No. 7,190,125, issued Mar. 13, 2007, entitled PROGRAMMABLE WALLBOX DIMMER, the entire disclosure of which is hereby incorporated by reference.

Figure 11:
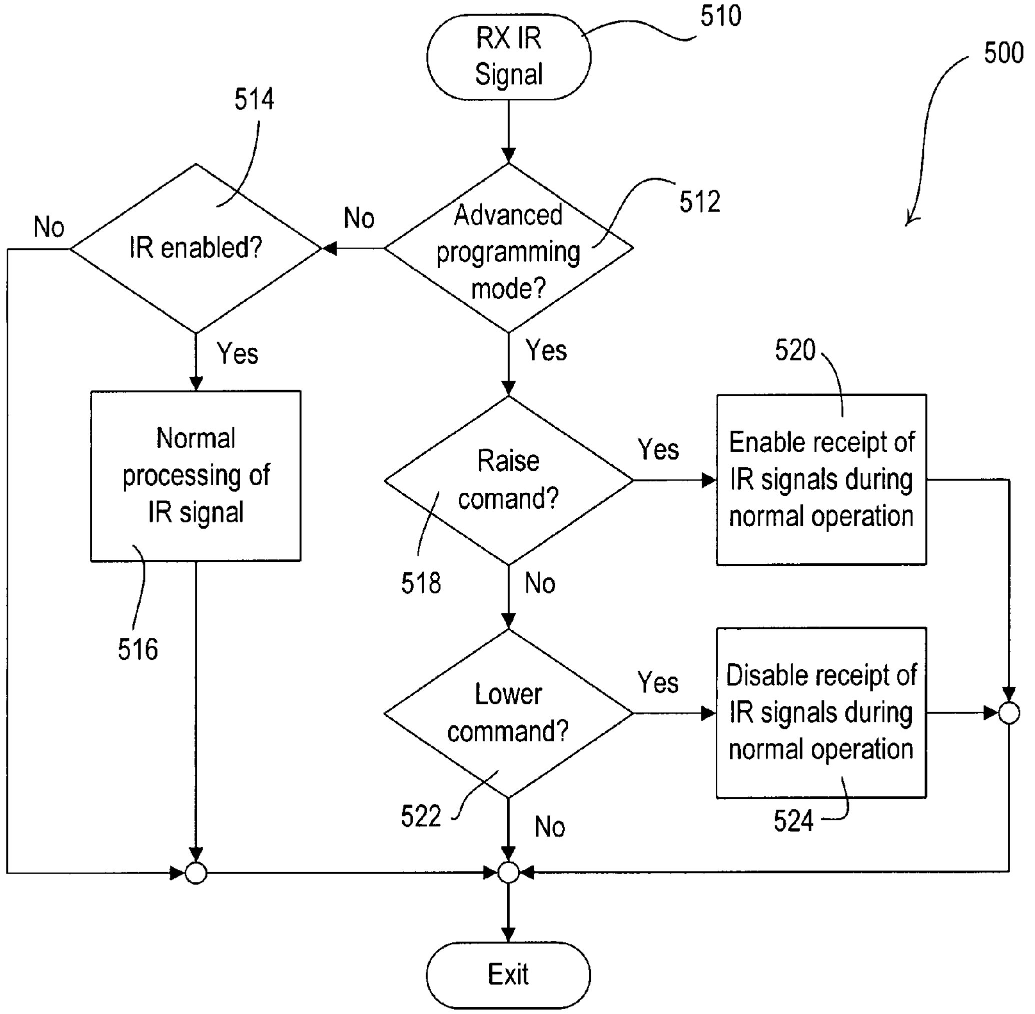
FIG. 11 is a simplified flowchart of an infrared (IR) keypad configuration procedure executed by the controller of the keypad of FIG. 7.

To configure a keypad as an IR keypad (e.g., if a keypad is being changed from a 2B keypad 120 to an IR keypad 160), the user must transmit a raise command to the IR keypad using the IR transmitter 190 while the IR keypad is in the advanced button programming mode. FIG. 11 is a simplified flowchart of an IR keypad configuration procedure 500 executed by the controller 170 in response to receiving an IR signal 192 at step 510. If the keypad is not in the advanced button programming mode at step 512, and the receipt of IR signals 192 is not enabled at step 514, the procedure 500 simply exits. However, if the receipt of IR signals 192 is enabled at step 514, the controller 170 processes the received IR signal 192 at step 516 as in normal operation, i.e., the intensities of the lighting load 104 and the movement of the motorized roller shades 106 are controlled in response to the received IR signal.

If the keypad is in the advanced button programming mode at step 512, the controller determines if the received IR signal is a raise command or a lower command. If the received IR signal 192 is a raise command at step 518, the controller 170 enables the receipt of IR signals during normal operation at step 520. If the received IR signal 192 is not a raise command at step 518, but is a lower command at step 522, the controller 170 disabled the receipt of IR signals during normal operation at step 524.

During the manufacture of a keypad, the keypad is preferably fitted with a button assembly and faceplate and is configured correctly using a procedure similar to the button configuration procedure 200 shown in FIG. 8 (except that step 210 is omitted). Accordingly, when installed, the keypad is configured correctly without the need of executing any configuration procedure. Alternatively, the base unit of the keypad (i.e., base unit 40) may be shipped separately from the faceplate and the button assembly. During installation, the user would install the base unit 40 with the button assembly and the faceplate, and then simply press and hold the top and bottom buttons for ten seconds in order to configure the keypad.

The controller 170 of the keypad is operable to be returned to a default (i.e., an "out-of-box") state after the button configuration is updated using the button configuration procedure 200. The default state may include a default button functionality and a default button configuration. The controller 170 may return to the default state in response to receiving a predetermined sequence of actuations of the buttons 178, e.g., a triple-tap of a single button followed by a press and hold of the same button for approximately three seconds followed by another triple-tap of the same button. Preferably, a triple-tap of a button comprises three transitory actuations of the button in quick succession.

The present invention is described herein showing keypads having either one of two button configurations. However, the button configuration procedure 200 of the present invention is not limited only one or two button configurations, but allows the keypad to have three or more button configurations. Further, the present invention is not limited to keypads only having only a maximum of seven scene-selection buttons or alternatively six scene-selection buttons plus a raise button and a lower button.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of configuring a keypad of a load control system to have first and second button configurations, the keypad comprising a plurality of switches, the method comprising the steps of:

mechanically coupling to the keypad a button assembly having first and second button configurations, each button configuration defining a number and arrangement of buttons on the button assembly;

simultaneously actuating a first button and a second button of the first button configuration to actuate at least two of the switches of the keypad for a predetermined amount of time;

the keypad detecting that the first button and the second button have been actuated for the predetermined amount of time;

the keypad subsequently storing in a memory a first keypad data representing the first button configuration dependent upon which tactile switches were actuated when the first and second buttons were actuated for the predetermined amount of time;

simultaneously actuating a third button and a fourth button of the second button configuration to actuate at least two other switches of the keypad for the predetermined amount of time after a keypad has stored the first keypad data representing the first button configuration in the memory;

the keypad detecting that the third button and the fourth button have been actuated for the predetermined amount of time; and the keypad subsequently storing in the memory a second keypad data representing the second button configuration dependent upon which tactile switches were actuated when the third and fourth buttons were actuated for the predetermined amount of time.

2. The method of claim 1, wherein the first button configuration of the button assembly comprises a first group of buttons and the second button configuration comprises a second group of buttons, the first button and the second button of the first button configuration comprising the top button and the bottom button of the first group of buttons, respectively, and the third button and the fourth button of the first button configuration comprising the top button and the bottom button of the second group of buttons, respectively.

3. The method of claim 2, wherein the buttons of the first and second groups of buttons are grouped together.

4. The method of claim 1, further comprising the step of:

the keypad illuminating a plurality of backlights in response the first and second button configurations being stored in the memory of the keypad, the backlights operable to illuminate the buttons of the button assembly.

5. The method of claim 1, further comprising the step of:

the keypad determining if any of the tactile switches actuated by the buttons between the third and fourth button of the second button configuration were also actuated by the buttons of the first button configuration prior to the keypad storing the second keypad data representing the second button configuration in the memory.

6. The method of claim 5, further comprising the step of:

the keypad clearing the first data representing the first button configuration from the memory if any of the tactile switches actuated by the buttons between the third and fourth button of the second button configuration were also actuated by the buttons of the first button configuration.

7. The method of claim 1, further comprising the steps of:

the keypad blinking a first plurality of visual indicators after the keypad detects that the first and second buttons have been actuated for the predetermined amount of time; and the keypad blinking a second plurality of visual indicators after the keypad detects that the third and fourth buttons have been actuated for the predetermined amount of time.

8. The method of claim 7, wherein the first plurality of visual indicators are representative of the first button configuration and the second plurality of visual indicators are representative of the second button configuration.

9. The method of claim 1, further comprising the steps of:

the keypad entering an advanced programming mode in response to the keypad detecting that the first button and the second button have been actuated for the predetermined amount of time; and the keypad subsequently changing the data representing the first button configuration in the memory using the advanced programming mode.

10. The method of claim 1, wherein the predetermined amount of time is approximately ten seconds.

11. A method of configuring a keypad for use in a load control system, the keypad comprising a plurality of switches, the method comprising the steps of:

installing a first button assembly on the keypad, the first button assembly having a first button configuration defining the number and arrangement of buttons on the first button assembly;

the keypad storing in a memory of the keypad a first data representing the first button configuration;

removing the first button assembly from the keypad;

installing a second button assembly on the keypad, the second button assembly having a second button configuration defining the number and arrangement of buttons on the second button assembly;

simultaneously actuating a first button and a second button of the second button assembly to actuate at least two of the switches of the keypad for a predetermined amount of time;

the keypad detecting that the first button and the second button of the second button assembly have been actuated for the predetermined amount of time;

the keypad subsequently determining if any of the tactile switches actuated by the buttons between the first button and the second button of the second button assembly were also actuated by the buttons of the first button configuration of the first button assembly; and the keypad storing in the memory of the keypad a second data representing the second button configuration dependent upon which tactile switches were actuated when the first and second buttons were actuated for the predetermined amount of time.

12. The method of claim 11, further comprising the step of:

the keypad clearing the first data representing the first button configuration from the memory if any of the tactile switches actuated by the buttons between the first button and the second button of the second button assembly were also actuated by the buttons of the first button configuration of the first button assembly.

13. A method of configuring a keypad for use in a load control system, the keypad comprising an infrared receiver and a plurality of switches, the method comprising the steps of:

mechanically coupling with a button assembly to the keypad;

simultaneously actuating a first button and a second button of the button assembly to actuate at least two of the switches of the keypad for a predetermined amount of time;

the keypad entering an advanced programming mode in response to the step of simultaneously actuating a keypad detecting that the first button and the second button have been actuated for the predetermined amount of time;

the keypad subsequently receiving an infrared command via the infrared receiver; and the keypad enabling the infrared receiver during normal operation of the keypad.

14. The method of claim 13, wherein the button assembly has a button configuration, the method further comprising the steps of:

the keypad detecting that the first button and the second button have been actuated for the predetermined amount of time; and the keypad subsequently storing in a memory of a the keypad data representing the button configuration of the button assembly dependent upon which tactile switches were actuated for the predetermined amount of time.

* * * * *